(12) United States Patent
Lin et al.

(10) Patent No.: US 10,811,578 B1
(45) Date of Patent: Oct. 20, 2020

(54) LED CARRIER AND LED PACKAGE HAVING THE SAME

(71) Applicant: Lextar Electronics Corporation, Hsinchu (TW)

(72) Inventors: Chih-Hao Lin, Hsinchu (TW); Chun-Peng Lin, Hsinchu (TW); Chang-Han Chen, Hsinchu (TW); Kuang-Neng Yang, Hsinchu (TW); Cheng-Ta Kuo, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/367,232

(22) Filed: Mar. 27, 2019

(51) Int. Cl.
*H01L 33/00* (2010.01)
*H01L 33/60* (2010.01)
*H01L 33/62* (2010.01)
*H01L 33/58* (2010.01)
*H01L 33/48* (2010.01)

(52) U.S. Cl.
CPC ............ *H01L 33/60* (2013.01); *H01L 33/486* (2013.01); *H01L 33/58* (2013.01); *H01L 33/62* (2013.01)

(58) Field of Classification Search
CPC ....................................................... H01L 33/60
See application file for complete search history.

(56) References Cited

U.S. PATENT DOCUMENTS

2009/0267093 A1* 10/2009 Kamada ................ H01L 33/483
257/98

FOREIGN PATENT DOCUMENTS

| TW | 506145 B | 10/2002 |
|----|----------|---------|
| TW | 201533930 A | 9/2015 |
| TW | I601319 B | 10/2017 |
| TW | I613840 B | 2/2018 |

* cited by examiner

*Primary Examiner* — Samuel A Gebremariam
(74) *Attorney, Agent, or Firm* — CKC & Partners Co., LLC

(57) ABSTRACT

A LED carrier includes a substrate, a conductive layer, an adhesive layer, and a reflector. The conductive layer is disposed on the substrate, and has a bonding portion and an extending portion. The bonding portion has a top surface higher than a top surface of the extending portion. The adhesive layer covers the extending portion of the conductive layer and exposes the bonding portion of the conductive layer. The reflector is disposed over the adhesive layer. The adhesive layer has a hook portion in contact with a corner of the reflector.

16 Claims, 10 Drawing Sheets

LED CARRIER AND LED PACKAGE HAVING THE SAME

BACKGROUND

Technical Field

The present disclosure relates to a LED carrier.

Description of Related Art

A LED package typically includes a LED chip and a reflecting member (e.g., a reflector cup) that is configured to direct the light emitted by the LED chip. In conventional LED packages, the reflecting member is mounted on the substrate of the LED package using adhesives. Sometimes, the reflecting member is incorrectly positioned as it may be inadvertently shifted before the adhesive hardens. In addition, the reflecting member may detach from the substrate due to the degradation of the adhesive, which is caused by the adhesive being directly exposed to the light emitted by the LED chip without any protection.

SUMMARY

In view of the foregoing, one of the objects of the present disclosure is to provide a LED carrier with firmly attached and accurately positioned reflector.

To achieve the objective stated above, in accordance with some embodiments of the present disclosure, a LED carrier includes a substrate, a conductive layer, an adhesive layer, and a reflector. The conductive layer is disposed on the substrate, and has a bonding portion and an extending portion. The bonding portion has a top surface higher than a top surface of the extending portion. The adhesive layer covers the extending portion of the conductive layer and exposes the bonding portion of the conductive layer. The reflector is disposed over the adhesive layer. The adhesive layer has a hook portion in contact with a corner of the reflector.

In one or more embodiments of the present disclosure, the corner of the reflector defines an opening. The bonding portion passes through the opening.

In one or more embodiments of the present disclosure, the reflector has a bottom surface surrounding the opening. The hook portion is in contact with the bottom surface.

In one or more embodiments of the present disclosure, the reflector has an inclined inner surface surrounding the opening. The hook portion extends through the opening and contacts the inner surface.

In one or more embodiments of the present disclosure, the hook portion wraps the corner of the reflector.

In one or more embodiments of the present disclosure, the reflector has a block located at the corner.

In one or more embodiments of the present disclosure, the corner has a side surface perpendicular to a bottom surface of the reflector.

In one or more embodiments of the present disclosure, the corner of the reflector has a rounded shape.

In one or more embodiments of the present disclosure, the hook portion is formed with an angle matching an angle of the corner.

In one or more embodiments of the present disclosure, the hook portion fills a gap between the bonding portion and the reflector.

In one or more embodiments of the present disclosure, the conductive layer further has a positioning recess. The reflector has a protruding portion that faces the substrate and extends into the positioning recess.

In one or more embodiments of the present disclosure, the adhesive layer fills the positioning recess of the conductive layer and wraps the protruding portion of the reflector.

In one or more embodiments of the present disclosure, the reflector has a positioning recess. The conductive layer further has a protruding portion that extends into the positioning recess.

In one or more embodiments of the present disclosure, the adhesive layer fills the positioning recess of the reflector and wraps the protruding portion of the conductive layer.

In accordance with some embodiments of the present disclosure, a LED package includes the aforementioned LED carrier and a LED chip. The LED chip is disposed on the bonding portion and is electrically coupled to the bonding portion.

In one or more embodiments of the present disclosure, the bonding portion is geometrically similar to the LED chip.

In one or more embodiments of the present disclosure, the LED package further includes a bonding wire. The LED chip is electrically coupled to the bonding portion by the bonding wire.

In one or more embodiments of the present disclosure, the bonding portion has a greater area than the LED chip in a top viewpoint.

In one or more embodiments of the present disclosure, the substrate includes ceramics.

In one or more embodiments of the present disclosure, the LED package further includes a lens that is fixed to the reflector.

In sum, the LED carrier of the present disclosure is featured with an adhesive layer having a hook portion. The hook portion of the adhesive layer engages with the bottom corner of the reflector to firmly secure the reflector on the adhesive layer. In addition, the conductive layer has an elevated bonding portion which protects the adhesive layer from the light emitted by the LED chip.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
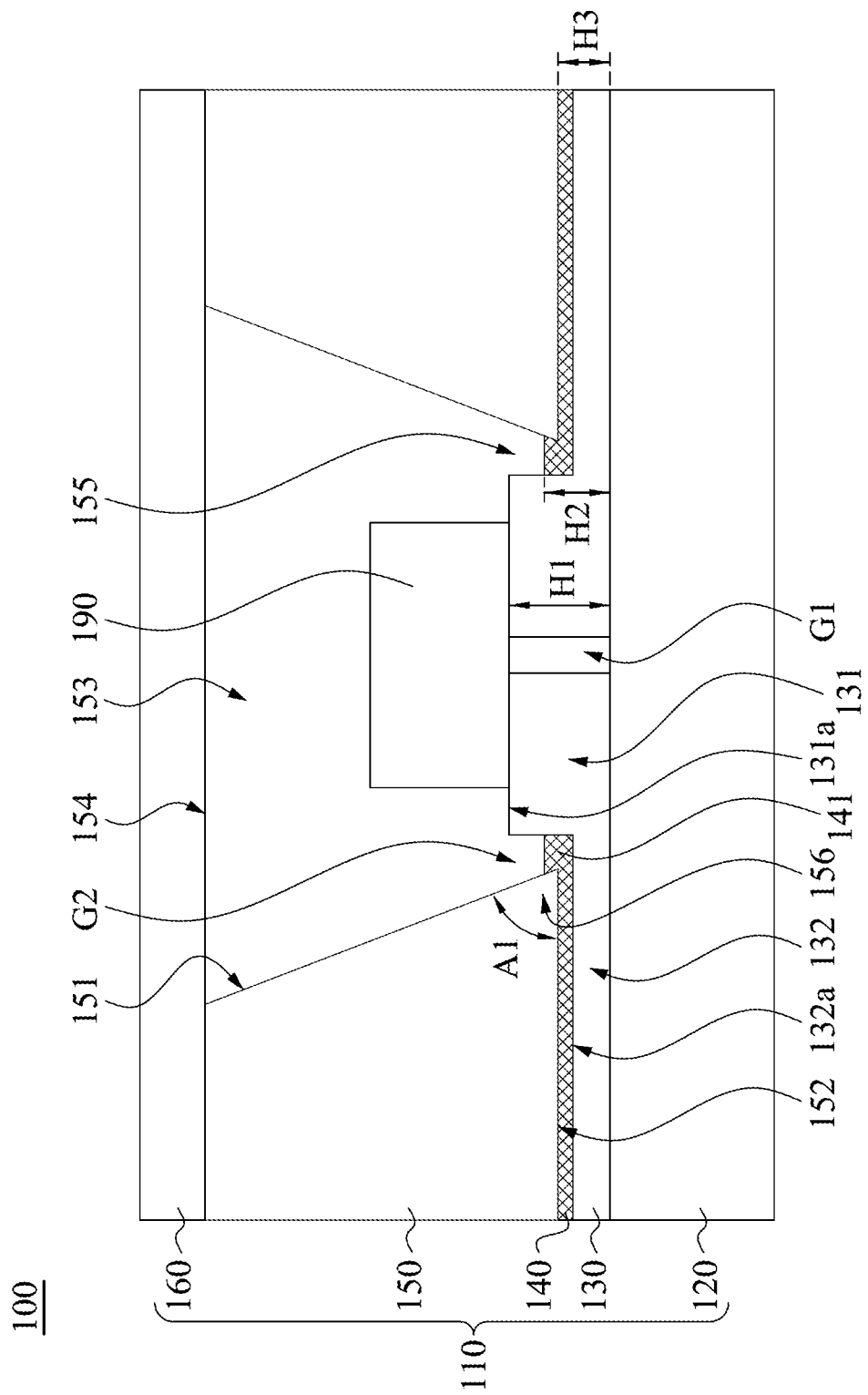
FIG. 1 illustrates a schematic cross-sectional view of a LED package in accordance with an embodiment of the present disclosure.

Reference will now be made in detail to the present embodiments of the present disclosure, examples of which are illustrated in the accompanying drawings. Wherever possible, the same reference numerals are used in the drawings and the description to refer to the same or like parts.

Figure 2:
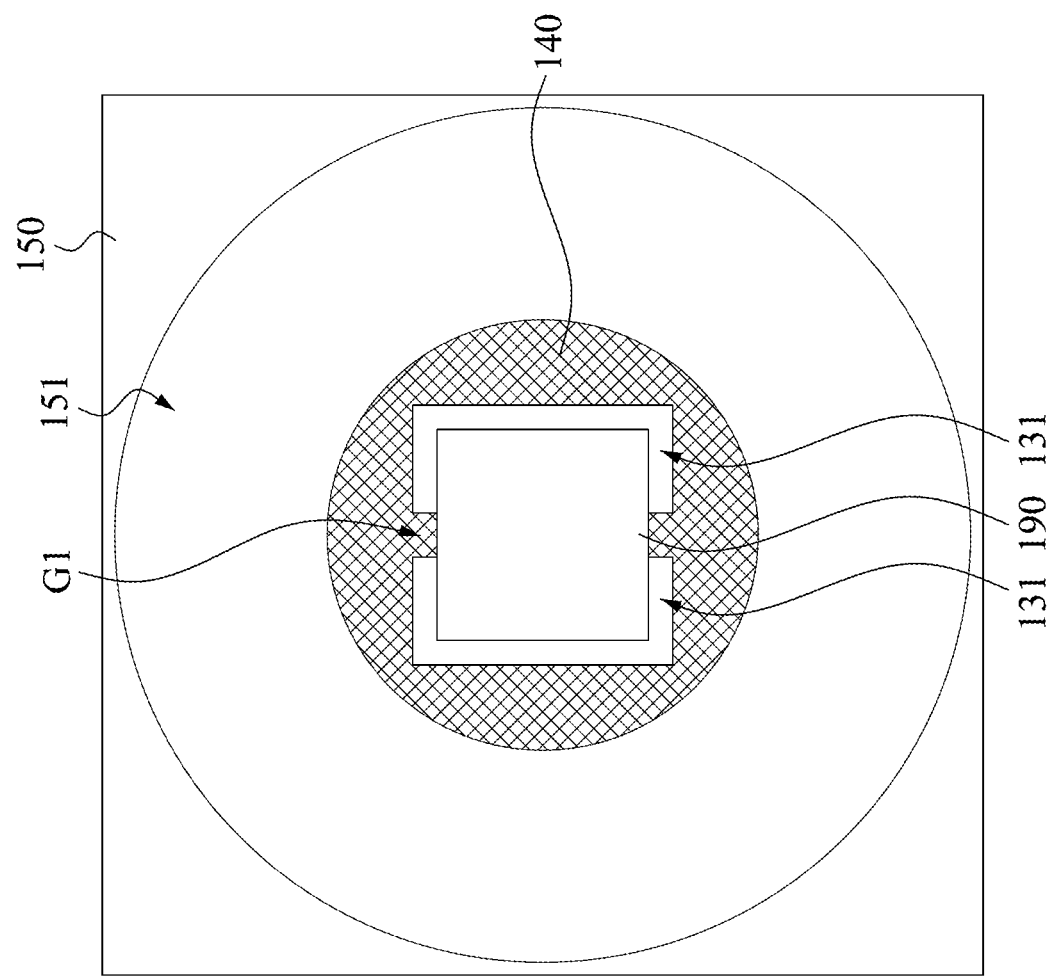
FIG. 2 is a schematic top view of the LED package shown in FIG. 1.

Reference is made to FIGS. 1 and 2. FIG. 1 illustrates a schematic cross-sectional view of a LED package 100 in accordance with an embodiment of the present disclosure. FIG. 2 is a schematic cross-sectional view of the LED package shown in FIG. 1. As shown in FIG. 1, the LED package 100 includes a LED chip 190 and a LED carrier 110 configured to accommodate the LED chip 190. The LED carrier 110 includes a substrate 120, a conductive layer 130, an adhesive layer 140, and a reflector 150. The conductive layer 130 is disposed on the substrate 120 and includes a bonding portion 131 and an extending portion 132. The extending portion 132 is connected to and surrounds the bonding portion 131. The bonding portion 131 is elevated with respect to the extending portion 132. In other words, the bonding portion 131 has a top surface 131a higher than a top surface 132a of the extending portion 132.

In some embodiments, the substrate 120 includes ceramics. In some embodiments, the conductive layer 130 includes Cu, Ni, Au, Ag, Au—Sn alloy, Ni—Sn alloy, Sn—Ag—Cu alloy, Fe—Co—Ni alloy, other suitable conductive materials, or any combination thereof.

As shown in FIG. 1, the LED chip 190 is disposed on the top surface 131a of the bonding portion 131 and is electrically coupled to the bonding portion 131 using flip chip mounting techniques. In some embodiments, the conductive layer 130 has a groove G1 passing through the bonding portion 131, such that the conductive layer 130 is separated into two electrodes that are electrically connected to the cathode (not shown) and the anode (not shown) of the LED chip 190 respectively. In some embodiments, the bonding portion 131 is geometrically similar to the LED chip 190. For example, as shown in FIG. 2, the bonding portion 131 and the LED chip 190 are both square in shape. However, the present disclosure is not limited to such geometric configuration. The bonding portion 131 may be formed with other suitable shapes (e.g., the bonding portion 131 has a circular shape in FIG. 8).

As shown in FIG. 1, the adhesive layer 140 is disposed on the top surface 132a of the extending portion 132 of the conductive layer 130. The adhesive layer 140 covers the extending portion 132 of the conductive layer 130 and exposes the bonding portion 131. The reflector 150 is disposed over the adhesive layer 140. In the present embodiment, the reflector 150 is cup-shaped (i.e., the reflector 150 is a reflector cup). The reflector 150 has an inner surface 151 and a bottom surface 152. The inner surface 151 is inclined relative to the bottom surface 152 and defines an internal space 153. The internal space 153 penetrates through the reflector 150 from the top to the bottom, thereby forming a top opening 154 and a bottom opening 155, which is surrounded by both the inner surface 151 and the bottom surface 152. The bottom opening 155 is configured to allow the bonding portion 131 to pass through. In this way, the bonding portion 131 may guide the installation of the reflector 150, such that the reflector 150 may be mounted at the desired position.

As shown in FIG. 1, the inner surface 151 and the bottom surface 152 meets at a lower corner 156, which defines the bottom opening 155. In the present embodiment, the lower corner 156 has triangular cross section. The adhesive layer 140 has a hook portion 141 which is in contact with the lower corner 156. Specifically, the hook portion 141 is in contact with the bottom surface 152 of the reflector 150 and extends through the bottom opening 155 to contact the inner surface 151 of the reflector 150. With the lower corner 156 being engaged by the hook portion 141, the reflector 150 is firmly attached on the adhesive layer 140.

In some embodiments, as shown in FIG. 1 and FIG. 2, the hook portion 141 fills a gap G2 between the bonding portion 131 and reflector 150, such that the hook portion 141 surrounds the bonding portion 131. In some embodiments, as shown in FIG. 1, the hook portion 141 is formed with an angle matching that of the lower corner 156 (i.e., the hook portion 141 and the lower corner 156 both having angle A1), such that the hook portion 141 tightly wraps the lower corner 156.

In some embodiments, as shown in FIG. 1, as measured from the substrate 120, a height H1 of the bonding portion 131 is greater than a height H2 of the hook portion 141, which is in turn greater than a height H3 of the lower corner 156. In some embodiments, as shown in FIG. 2, the bonding portion 131 has a greater area than the LED chip 190 in a top viewpoint (i.e., viewing through the top opening 154 of the reflector 150). In other words, the bonding portion 131 has a cross-sectional area greater than an area of the LED chip 190. With the aforementioned structural configuration, the hook portion 141, and thus the adhesive layer 140 may be protected from the light emitted by the LED chip. As such, the degradation of the adhesive layer 140 caused by direct exposure to the LED light may be delayed, and the likelihood of the detachment of the reflector 150 is lowered accordingly.

In some embodiments, the reflector 150 includes polymer materials such as PE, PT, PC, PMMA, and Teflon, ceramic materials such as $Al_2O_3$, AlN, and $ZrO_2$, metallic materials such as Fe, Al, Cu, and stainless steel, other suitable materials, or any combination thereof. In some embodiments, the reflector 150 includes a reflective layer (not shown) covering the inner surface 151. The reflective layer may include metallic materials such as Al, Ag, and Au. In some embodiments, the reflector 150 further includes a protective layer (not shown) covering the reflective layer. The protective layer may include oxide such as $TiO_2$ and $SiO_2$. In some embodiments, the adhesive layer 140 includes polymer materials such as epoxy and silicone, inorganic materials, other suitable materials, or any combination thereof.

In some embodiments, as shown in FIG. 1, the LED carrier 110 further includes a lens 160 that is fixed on the reflector 150 and covers the top opening 154 of the reflector 150. The lens 160 serves to redirect the light reflected by the inner surface 151 of the reflector 150. For example, the lens 160 may be configured to concentrate the light reflected by the inner surface 151. In some embodiments, the lens includes glass, quartz (silicon dioxide), sapphire, calcium fluoride, organic materials such as PC and PMMA, other suitable transparent materials, or any combination thereof.

Figure 3:
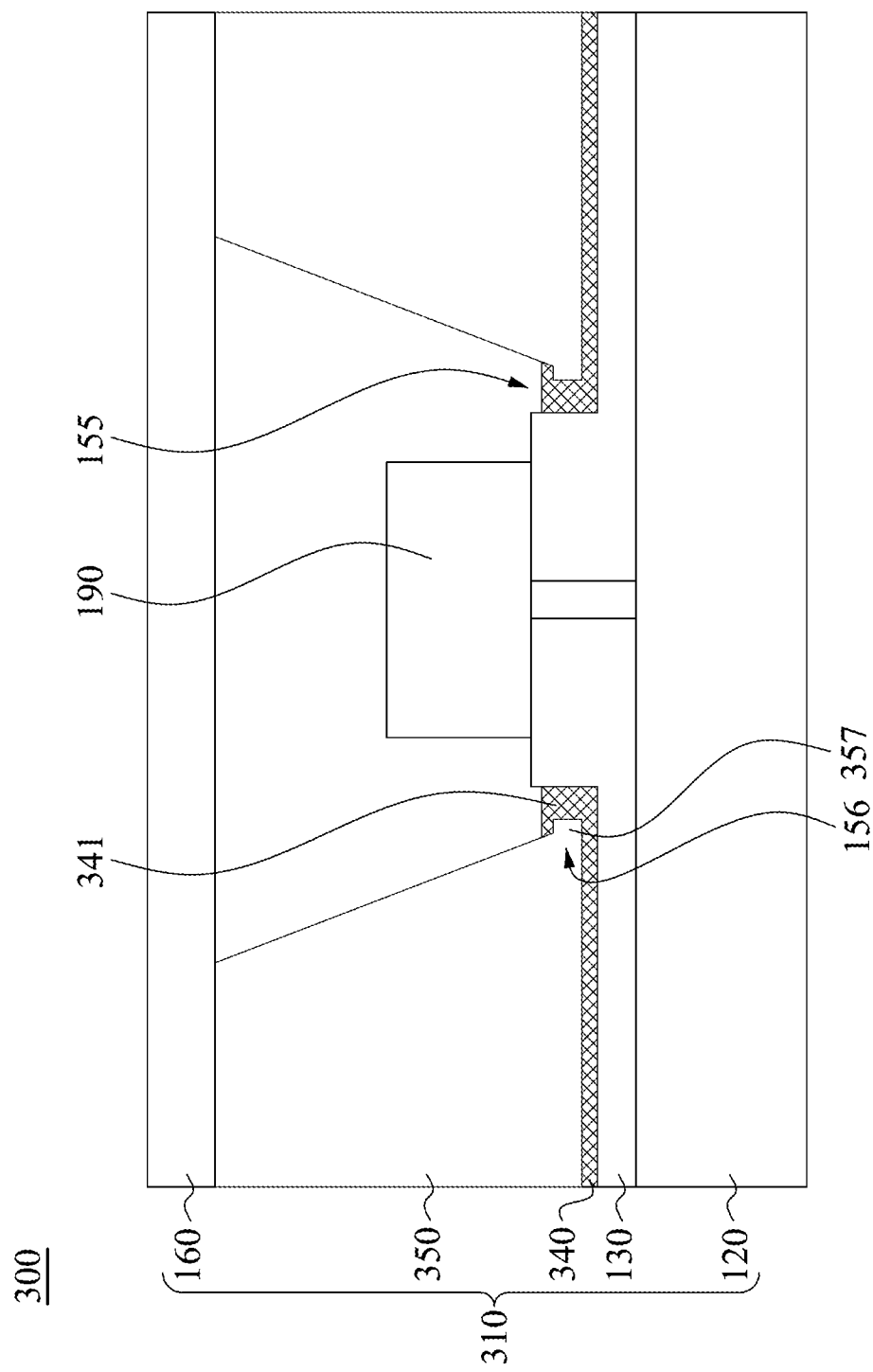
FIG. 3 illustrates a schematic cross-sectional view of a LED package in accordance with another embodiment of the present disclosure.

Reference is made to FIG. 3, which illustrates a schematic cross-sectional view of a LED package 300 in accordance with another embodiment of the present disclosure. The LED package 300 includes a LED chip 190 and a LED carrier 310. The LED carrier 310 includes a substrate 120, a conductive layer 130, an adhesive layer 340, a reflector 350, and a lens 160. Like reference numerals refer to like elements that are substantially identical to those previously described with reference to FIGS. 1 and 2. Descriptions regarding these elements are not repeated herein for brevity.

As shown in FIG. 3, in some embodiments, the reflector 350 has a block 357 located at the lower corner 156. The block 357 has a rectangular cross section and defines the bottom opening 155 of the reflector 350. The hook portion 341 of the adhesive layer 340 is of shape complementary to the block 357 and covers the top surface of the block 357.

Figure 4:
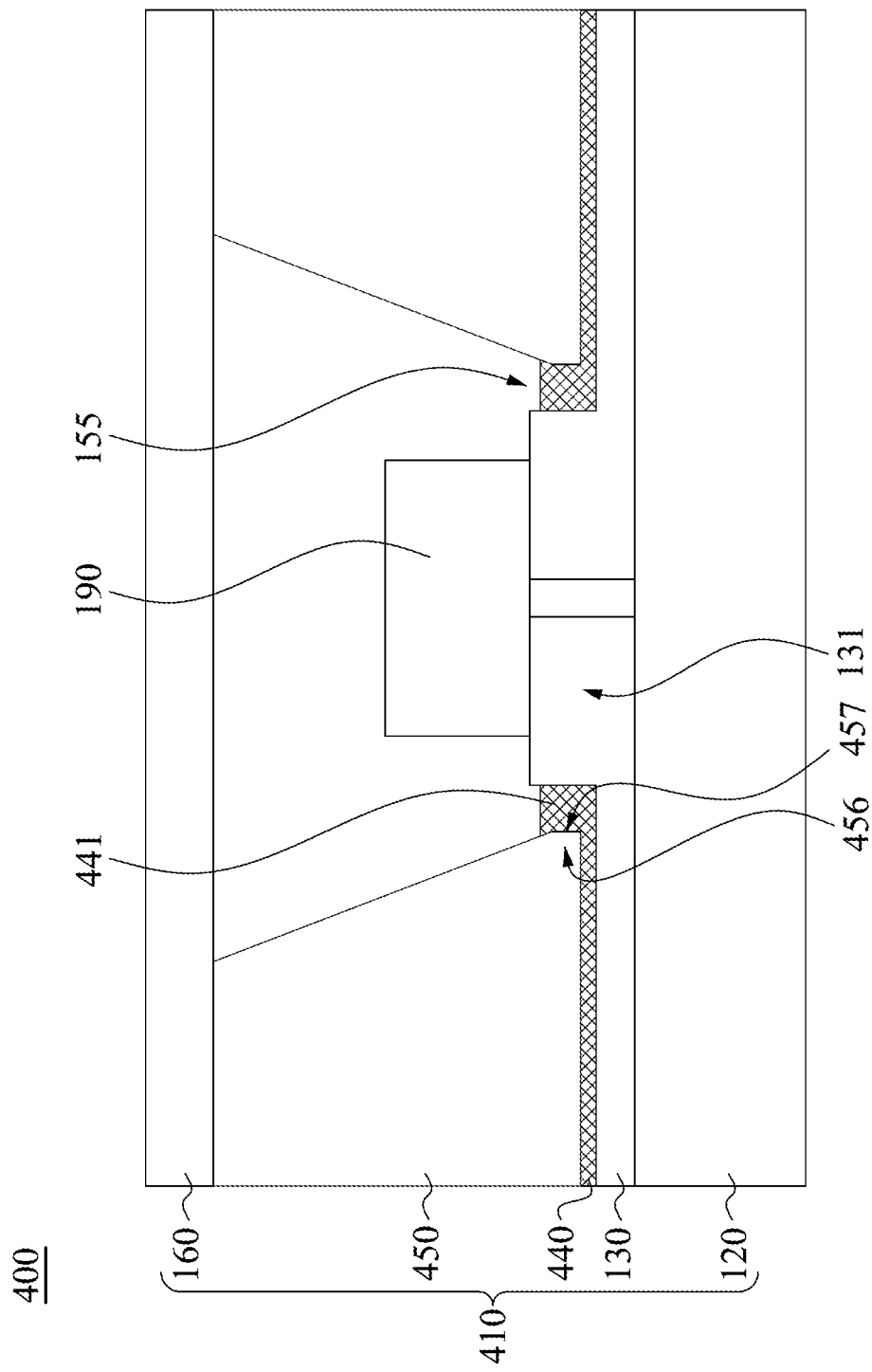
FIG. 4 illustrates a schematic cross-sectional view of a LED package in accordance with another embodiment of the present disclosure.

Reference is made to FIG. 4, which illustrates a schematic cross-sectional view of a LED package 400 in accordance with another embodiment of the present disclosure. The LED package 400 includes a LED chip 190 and a LED carrier 410. The LED carrier 410 includes a substrate 120, a conductive layer 130, an adhesive layer 440, a reflector 450, and a lens 160. Like reference numerals refer to like elements that are substantially identical to those previously described with reference to FIGS. 1 and 2. Descriptions regarding these elements are not repeated herein for brevity.

As shown in FIG. 4, in some embodiments, the lower corner 456 of the reflector 450 has trapezoidal cross section (i.e., the lower corner 456 has a "cutout"). The lower corner 456 has a side surface 457 that faces towards the bonding portion 131 and defines the bottom opening 155 of the reflector 450. The hook portion 441 of the adhesive layer 440 is of shape complementary to the lower corner 456 and covers the side surface 457 of the lower corner 456.

Figure 5:
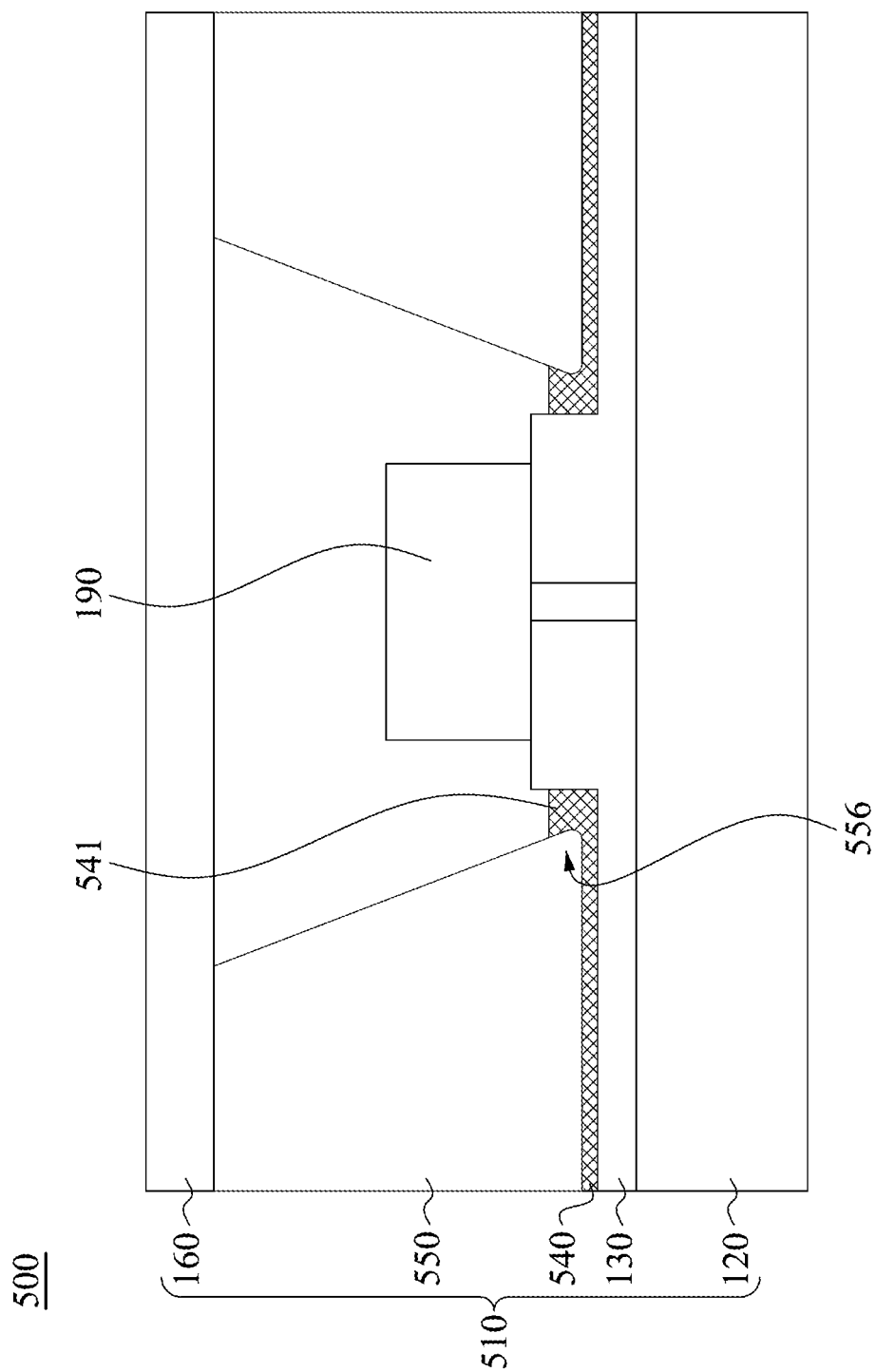
FIG. 5 illustrates a schematic cross-sectional view of a LED package in accordance with another embodiment of the present disclosure.

Reference is made to FIG. 5, which illustrates a schematic cross-sectional view of a LED package 500 in accordance with another embodiment of the present disclosure. The LED package 500 includes a LED chip 190 and a LED carrier 510. The LED carrier 510 includes a substrate 120, a conductive layer 130, an adhesive layer 540, a reflector 550, and a lens 160. Like reference numerals refer to like elements that are substantially identical to those previously described with reference to FIGS. 1 and 2. Descriptions regarding these elements are not repeated herein for brevity. As shown in FIG. 5, in some embodiments, the lower corner 556 of the reflector 550 is rounded. The hook portion 541 of the adhesive layer 540 is of shape complementary to the rounded lower corner 556 and wraps the rounded lower corner 556.

Figure 6:
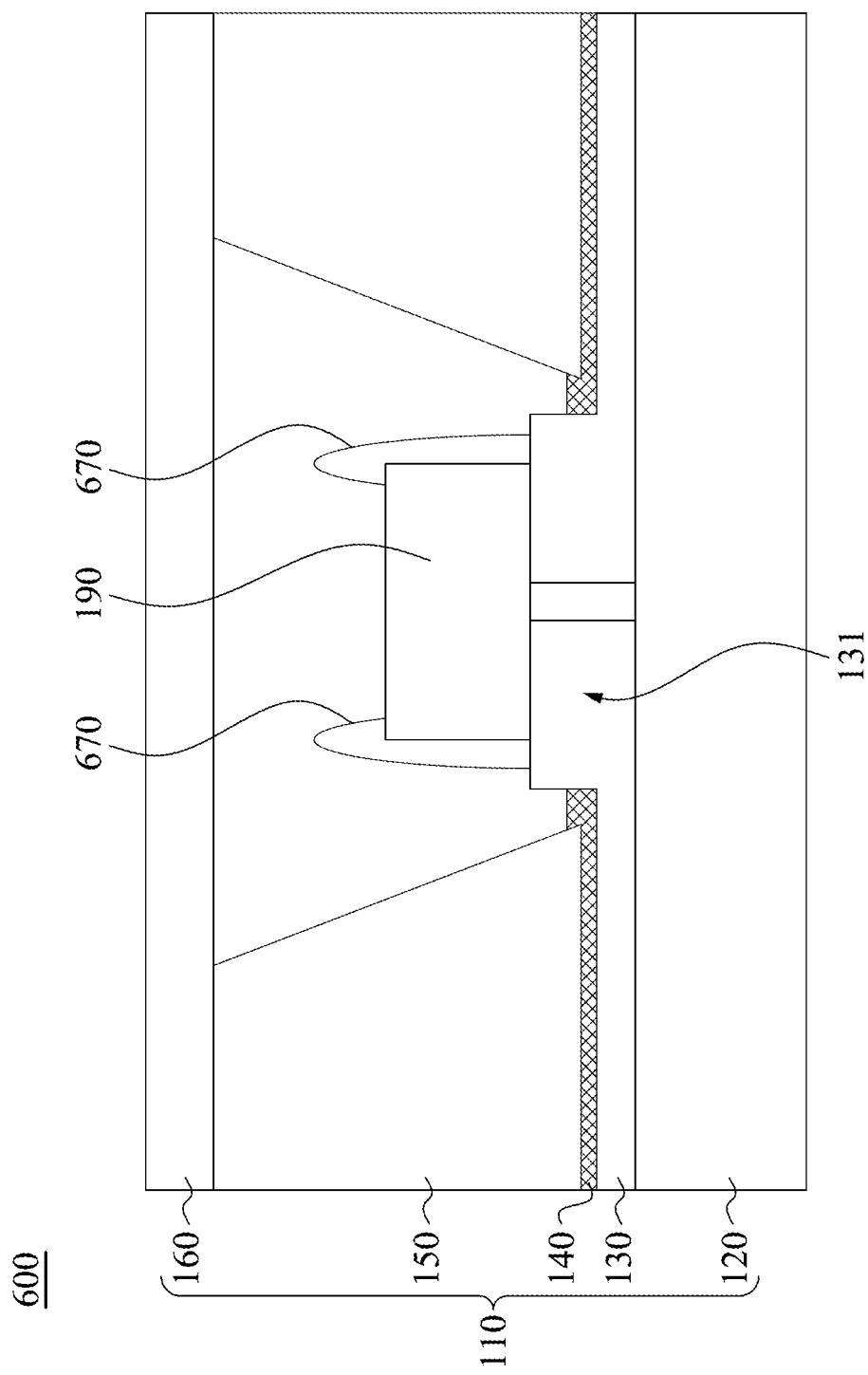
FIG. 6 illustrates a schematic cross-sectional view of a LED package in accordance with another embodiment of the present disclosure.

Reference is made to FIG. 6, which illustrates a schematic cross-sectional view of a LED package 600 in accordance with another embodiment of the present disclosure. The LED package 600 includes a LED chip 190 and a LED carrier 610. The LED carrier 610 includes a substrate 120, a conductive layer 130, an adhesive layer 640, a reflector 650, and a lens 160. Like reference numerals refer to like elements that are substantially identical to those previously described with reference to FIGS. 1 and 2. Descriptions regarding these elements are not repeated herein for brevity.

As shown in FIG. 6, in some embodiments, the LED chip 190 is connected to the bonding portion 131 using wire bonding techniques. Specifically, the LED package 600 further includes two bonding wires 670, and the LED chip 190 is electrically coupled to the bonding portion 131 by the bonding wires 670. One of the bonding wires 670 is connected between the cathode (not shown) of the LED chip 190 and one of the electrodes of the conductive layer 130, while the other bonding wire 670 is connected between the anode (not shown) of the LED chip 190 and the other electrode of the conductive layer 130.

Figure 7:
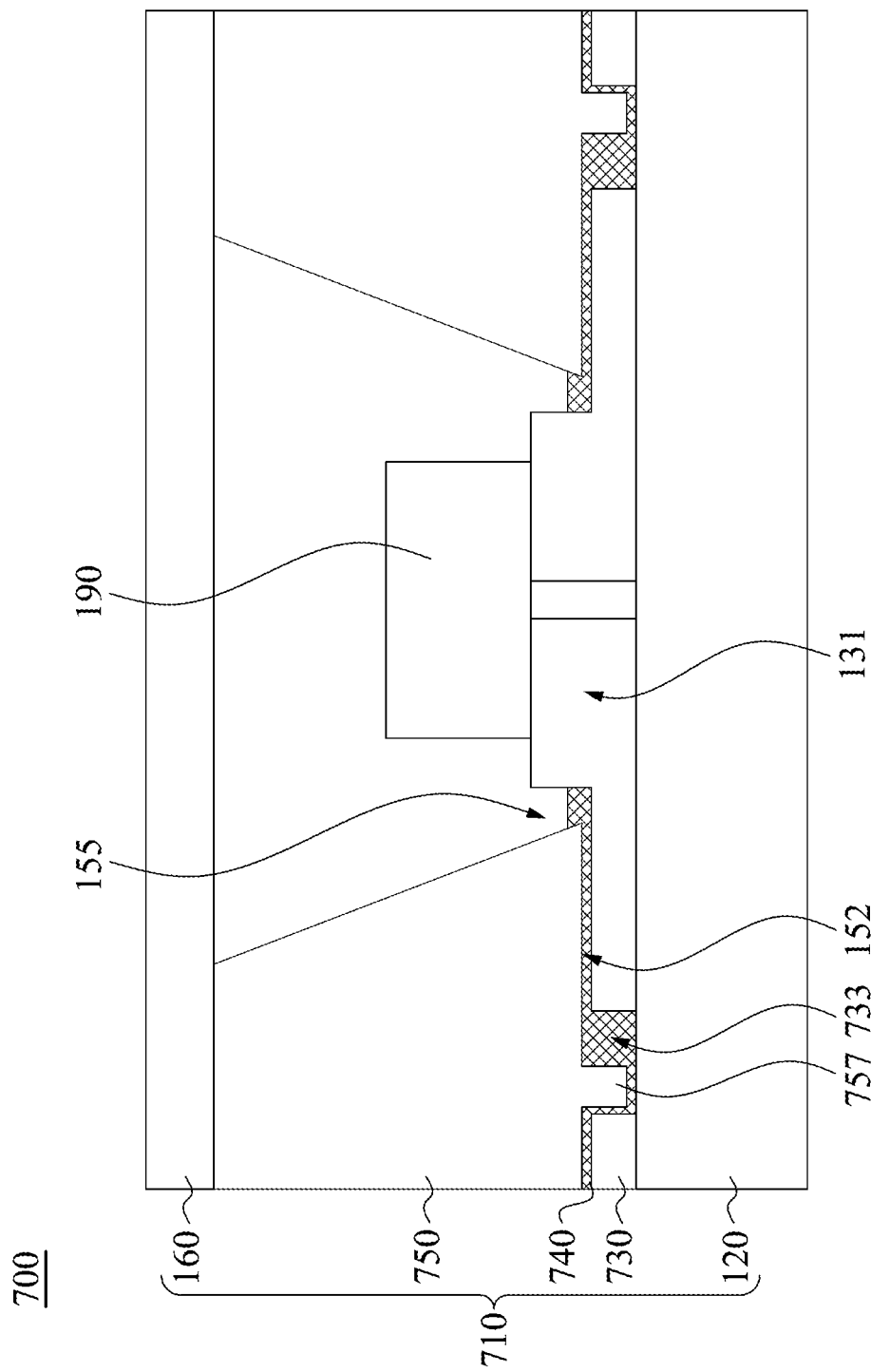
FIG. 7 illustrates a schematic cross-sectional view of a LED package in accordance with another embodiment of the present disclosure.
Figure 8:
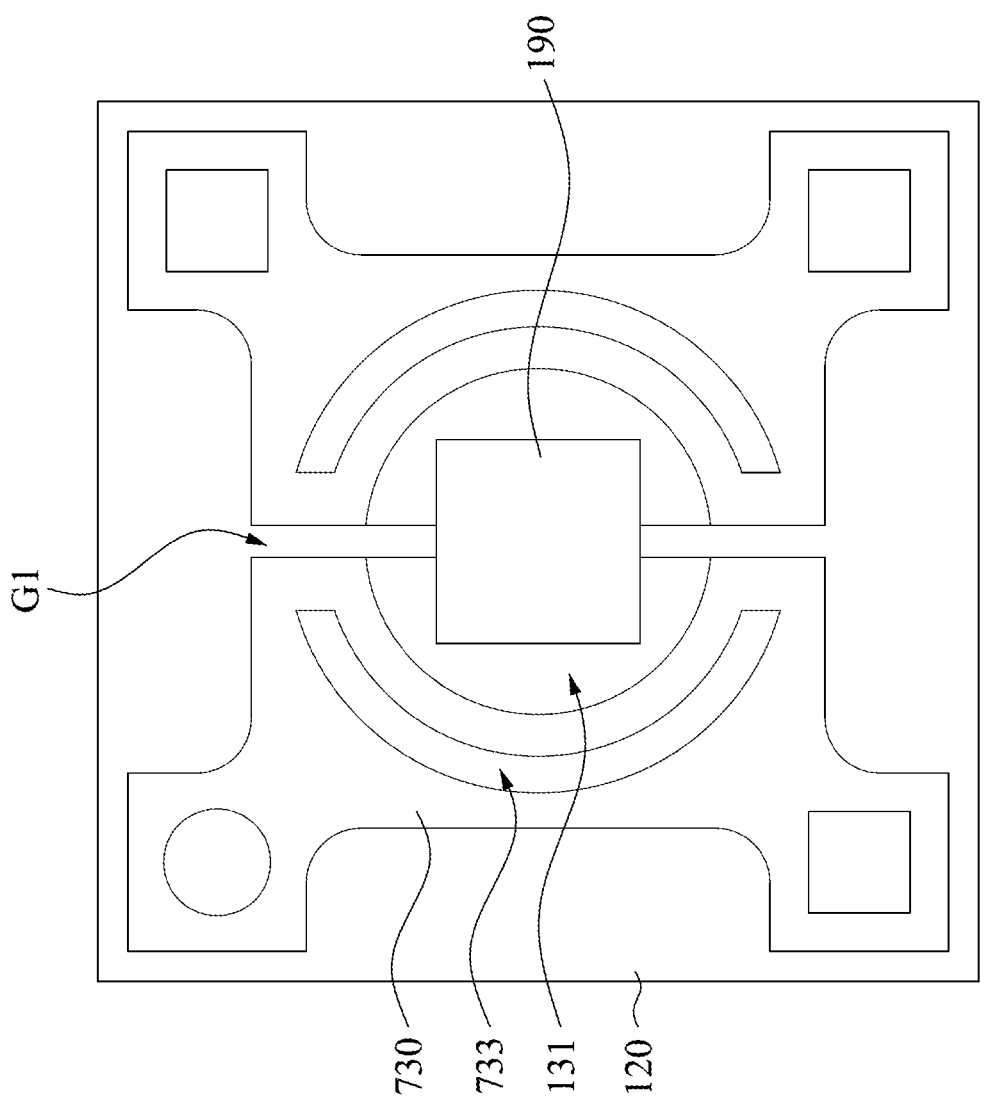
FIG. 8 is a schematic top view of some elements of the LED package shown in FIG. 7.

Reference is made to FIGS. 7 and 8. FIG. 7 illustrates a schematic cross-sectional view of a LED package 700 in accordance with another embodiment of the present disclosure. FIG. 8 is a schematic top view of some elements of the LED package 700 shown in FIG. 7. The LED package 700 includes a LED chip 190 and a LED carrier 710. The LED carrier 710 includes a substrate 120, a conductive layer 730, an adhesive layer 740, a reflector 750, and a lens 160. Like reference numerals refer to like elements that are substantially identical to those described with reference to FIGS. 1 and 2. Descriptions regarding these elements are not repeated herein for brevity.

In some embodiments, as shown in FIGS. 7 and 8, the conductive layer 730 further has two positioning recesses 733 that partially surround the bonding portion 131. The reflector 750 has two protruding portions 757 positioned on the bottom surface 152. The protruding portions 757 face the substrate 120 and partially surround the bottom opening 155. The protruding portions 757 are configured to extend into and engage with the positioning recesses 733 of the conductive layer 730. The adhesive layer 740 fills the positioning recess 733 of the conductive layer 730 and wraps the protruding portion 757 of the reflector 750. The engagement of the protruding portions 757 and the positioning recesses 733 may restrict the relative motion between the reflector 750 and the conductive layer 730, thereby preventing the reflector 750 from being inadvertently shifted before the adhesive layer 740 hardens.

Figure 9:
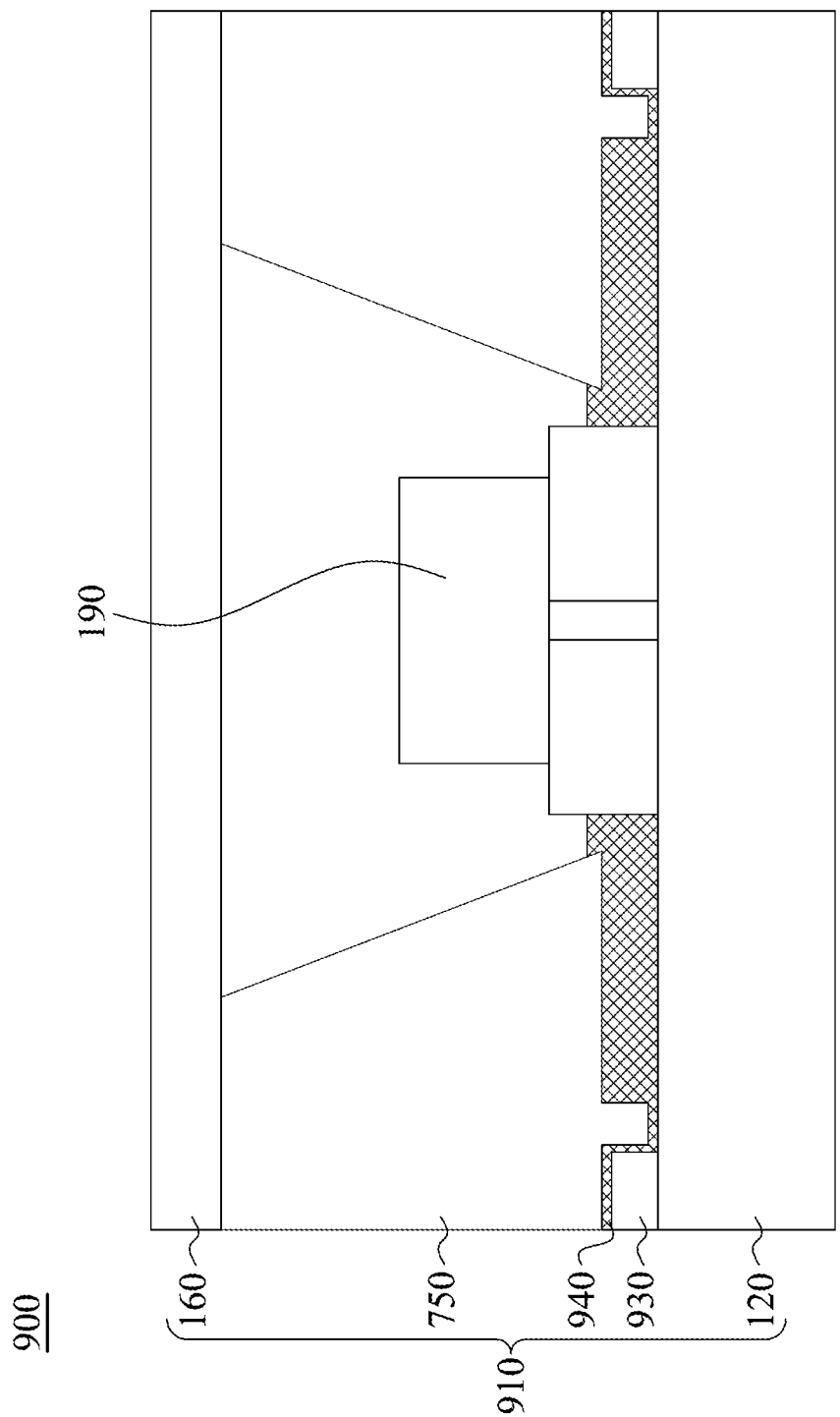
FIG. 9 illustrates a schematic cross-sectional view of a LED package in accordance with another embodiment of the present disclosure.

In some embodiments, as shown in FIG. 9, the LED carrier 910 of the LED package 900 includes a conductive layer 930 that has enlarged positioning recess 933 (as compared to the embodiment shown in FIG. 7). Specifically, a side of the positioning recess 933 adjoins a side surface of the bonding portion 131, such that the extending portion 132 is distributed on a side of the protruding portion 757 away from the bonding portion 131. With the aforementioned structural configuration, more adhesive may be applied between the reflector 750 and the substrate 120, resulting in a partially thickened adhesive layer 940.

Figure 10:
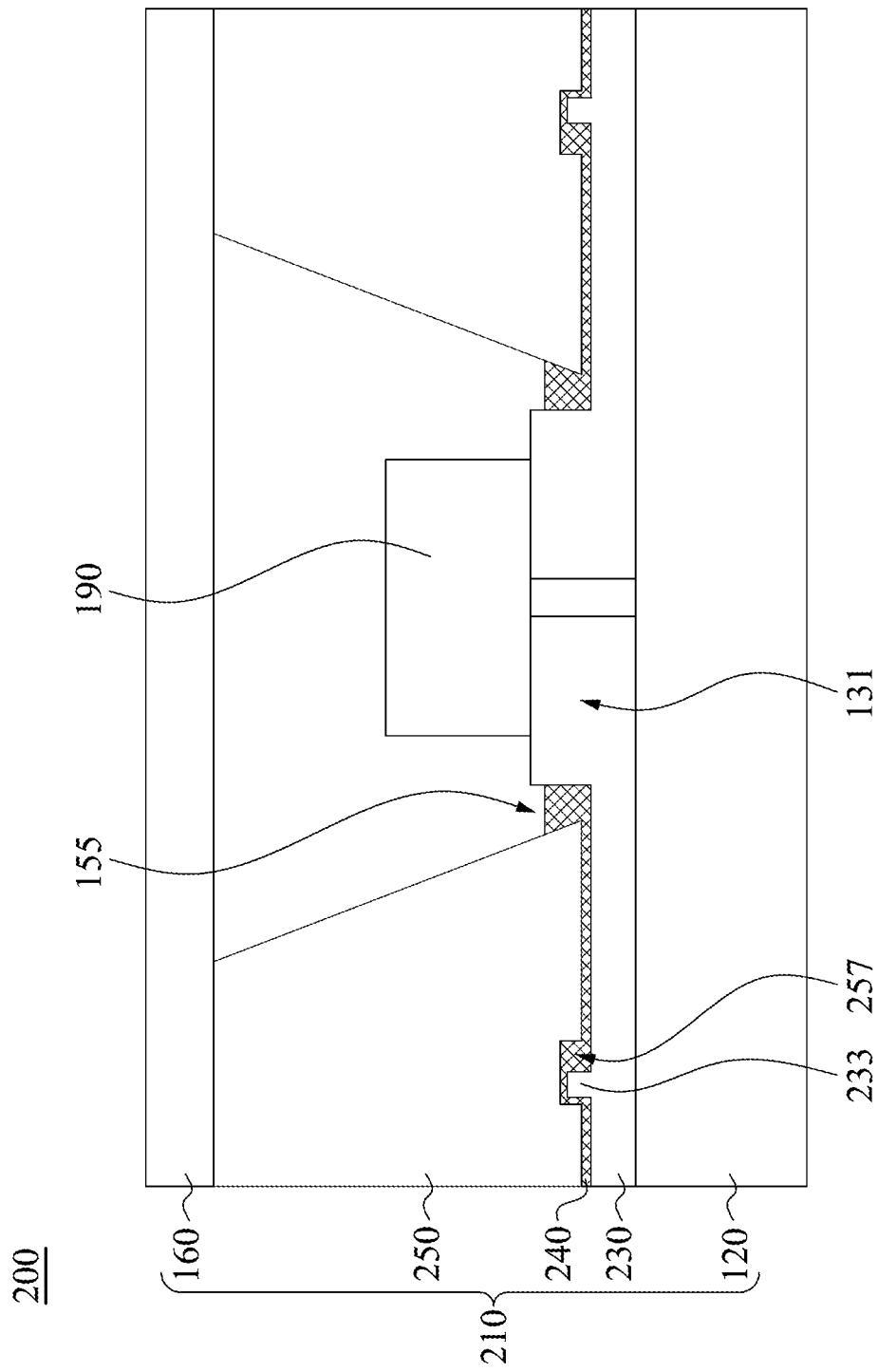
FIG. 10 illustrates a schematic cross-sectional view of a LED package in accordance with another embodiment of the present disclosure.

It is to be understood that, alternatively, the conductive layer may be provided with protruding structures, and the reflector may be provided with recessed structures configured to receive the protruding structures of the conductive layer. For example, as shown in FIG. 10, the LED carrier 210 of the LED package 200 includes a conductive layer 230 having two protruding portions 233, and a reflector 250 having two positioning recesses 257. The protruding portions 233 partially surround the bonding portion 131. The positioning recesses 257 are positioned on the bottom surface 152 and partially surround the bottom opening 155. The protruding portions 233 extend upward into the positioning recesses 257. The adhesive layer 240 fills the positioning recesses 257 of the reflector 250 and wraps the protruding portions 233 of the conductive layer 230.

In sum, the LED carrier of the present disclosure is featured with an adhesive layer having a hook portion. The hook portion of the adhesive layer engages with the bottom corner of the reflector to firmly secure the reflector on the adhesive layer. In addition, the conductive layer has an elevated bonding portion which protects the adhesive layer from the light emitted by the LED chip.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A LED carrier, comprising:
    a substrate;
    a conductive layer disposed on the substrate, the conductive layer having a bonding portion, the bonding portion having a top surface that is higher than a top surface of an extending portion of the conductive layer;
    an adhesive layer covering the extending portion of the conductive layer and exposing the bonding portion of the conductive layer; and
    a reflector disposed over the adhesive layer, wherein the adhesive layer has a hook portion in contact with a corner of the reflector;
    wherein the corner of the reflector defines an opening, and the bonding portion passes through the opening, wherein the reflector has an inclined inner surface surrounding the opening, and the hook portion extends through the opening and contacts the inner surface.

2. The LED carrier of claim 1, wherein the reflector has a bottom surface surrounding the opening, and the hook portion is in contact with the bottom surface.

3. The LED carrier of claim 1, wherein the hook portion wraps the corner of the reflector.

4. The LED carrier of claim 3, wherein the reflector has a block located at the corner.

5. The LED carrier of claim 3, wherein the corner has a side surface perpendicular to a bottom surface of the reflector.

6. The LED carrier of claim 3, wherein the corner of the reflector has a rounded shape.

7. The LED carrier of claim 1, wherein the hook portion is formed with an angle matching an angle of the corner.

8. The LED carrier of claim 1, wherein the hook portion fills a gap between the bonding portion and the reflector.

9. A LED package, comprising:
    the LED carrier of claim 1; and
    a LED chip disposed on the bonding portion and electrically coupled to the bonding portion.

10. The LED package of claim 9, wherein the bonding portion is geometrically similar to the LED chip.

11. The LED package of claim 9, further comprising a bonding wire, wherein the LED chip is electrically coupled to the bonding portion by the bonding wire.

12. The LED package of claim 9, wherein the bonding portion has a greater area than the LED chip in a top viewpoint.

13. The LED package of claim 9, wherein the substrate comprises ceramics.

14. The LED package of claim 9, further comprising a lens, the lens being fixed to the reflector.

15. A LED carrier, comprising:
    a substrate;
    a conductive layer disposed on the substrate, the conductive layer having a bonding portion, the bonding portion having a top surface that is higher than a top surface of an extending portion of the conductive layer;
    an adhesive layer covering the extending portion of the conductive layer and exposing the bonding portion of the conductive layer; and
    a reflector disposed over the adhesive layer, wherein the adhesive layer has a hook portion in contact with a corner of the reflector;
    wherein the conductive layer further has a positioning recess, and the reflector has a protruding portion that faces the substrate and extends into the positioning recess, wherein the adhesive layer fills the positioning recess of the conductive layer and wraps the protruding portion of the reflector.

16. A LED carrier, comprising:
    a substrate,
    a conductive layer disposed on the substrate, the conductive layer having a bonding portion, the bonding portion having a top surface that is higher than a top surface of an extending portion of the conductive layer;
    an adhesive layer covering the extending portion of the conductive layer and exposing the bonding portion of the conductive layer, and
    a reflector disposed over the adhesive layer, wherein the adhesive layer has a hook portion in contact with a corner of the reflector;
    wherein the reflector has a positioning recess, and the conductive layer further has a protruding portion that extends into the positioning recess, wherein the adhesive layer fills the positioning recess of the reflector and wraps the protruding portion of the conductive layer.

* * * * *